US 6,402,579 B1

(12) United States Patent
Pichler et al.

(10) Patent No.: US 6,402,579 B1
(45) Date of Patent: Jun. 11, 2002

(54) ELECTRODE DEPOSITION FOR ORGANIC LIGHT-EMITTING DEVICES

(75) Inventors: Karl Pichler, Hopewell Junction, NY (US); Peter Devine, Milton (GB)

(73) Assignee: Cambridge Display Technology Limited (GB)

( * ) Notice: Subject to any disclaimer, the term of this patent is extended or adjusted under 35 U.S.C. 154(b) by 0 days.

(21) Appl. No.: 09/254,302

(22) PCT Filed: Sep. 4, 1997

(86) PCT No.: PCT/GB97/02395

§ 371 (c)(1),
(2), (4) Date: Dec. 23, 1999

(87) PCT Pub. No.: WO98/10473

PCT Pub. Date: Mar. 12, 1998

(30) Foreign Application Priority Data

| Sep. 4, 1996 | (GB) | 9618473 |
| Sep. 4, 1996 | (GB) | 9618474 |
| Sep. 4, 1996 | (GB) | 9618475 |
| Jun. 12, 1997 | (GB) | 9712295 |

(51) Int. Cl.⁷ ............................................. H05B 33/10
(52) U.S. Cl. ....................................................... 445/24
(58) Field of Search .......................................... 445/24

(56) References Cited

U.S. PATENT DOCUMENTS

| 4,539,507 A | | 9/1985 | VanSlyke et al. ............. 313/504 |
| 5,047,687 A | | 9/1991 | VanSlyke ...................... 313/503 |
| 5,059,861 A | | 10/1991 | Littman et al. ................ 313/503 |
| 5,059,862 A | | 10/1991 | VanSlyke et al. ............. 313/503 |
| 5,399,936 A | | 3/1995 | Namiki et al. ................ 313/504 |
| 5,429,884 A | | 7/1995 | Namiki et al. ................ 428/690 |
| 5,723,873 A | * | 3/1998 | Yang ............................. 257/40 |
| 5,747,930 A | * | 5/1998 | Utsugi .......................... 313/504 |
| 5,807,627 A | * | 9/1998 | Friend et al. ................. 313/504 |
| 5,857,886 A | * | 1/1999 | Iwanaga et al. ............... 445/24 |

FOREIGN PATENT DOCUMENTS

| EP | 0278757 A2 | 8/1988 |
| EP | 0443861 A2 | 8/1991 |

(List continued on next page.)

OTHER PUBLICATIONS

Nguyen et al., "Influence of Thermal And Plasma Treatments On The Electrical Properties Of Poly (para–phenylene vinylene)–Based Diodes," Synthetic Metals, 72, pp. 35–39, 1995.

Bulovic et al., "A Surface–Emitting Vacuum–Deposited Organic Light–Emitting Device," Applied Physics Letters, Jun. 2, 1997, vol. 70, No. 22, pp. 2954–2956, XP002051289.

Bulovic et al., "Transparent Organic Light–Emitting Devices," Applied Physics Letters, May 6, 1996, vol. 68, No. 19, pp. 2606–2608.

Suzuki et al., "Organic Light–Emitting Diodes With Radio Frequency Sputter–Deposited Electron Injecting Electrodes," Applied Physics Letters, Apr. 15, 1996, vol. 68, No. 16, pp. 2276–2278, XP000585170.

*Primary Examiner*—Kenneth J. Ramsey

(57) ABSTRACT

There is disclosed an organic light-emitting device having at least one layer of light-emissive organic material arranged between first and second electrodes, one of the first and second electrodes being a multilayer structure, each layer of the multilayer structure being a DC magnetron sputtered layer. There is also disclosed an organic light-emitting device having two or more layers of light-emissive organic material arranged between first and second electrodes, an uppermost layer of the organic material being more resistant to sputter deposition than an underlying layer of the organic material, and the electrode formed over the uppermost layer of organic material being a sputtered layer. There are also disclosed methods for making such structures.

6 Claims, 2 Drawing Sheets

FOREIGN PATENT DOCUMENTS

| | | |
|---|---|---|
| EP | 0468437 A2 | 1/1992 |
| EP | 0468438 A2 | 1/1992 |
| EP | 0468439 A2 | 1/1992 |
| EP | 0549345 A2 | 6/1993 |
| EP | 0553950 A2 | 8/1993 |
| EP | 0563009 A1 | 9/1993 |
| EP | 0605739 A1 | 7/1994 |
| EP | 0684753 A1 | 11/1995 |
| JP | 7-85973 | 3/1995 |
| JP | 7-150137 | 6/1995 |
| JP | 8-264278 | 10/1996 |
| JP | 9-35871 | 2/1997 |
| WO | WO 94/03031 | 2/1994 |
| WO | WO 95/24056 | 9/1995 |

\* cited by examiner

ELECTRODE DEPOSITION FOR ORGANIC LIGHT-EMITTING DEVICES

The field of the invention relates to organic light-emitting devices with improved electrodes and their deposition.

Organic light-emitting devices (OLEDs) such as described in U.S. Pat. No. 5,247,190 assigned to Cambridge Display Technology Limited or in Van Slyke et al, U.S. Pat. No. 4,539,507, the contents of which are herein incorporated by reference and example, have great potential for use in various display applications, either as monochrome or multi-colour displays. Principally, an OLED consists of an anode that injects positive charge carriers, a cathode that injects negative charge carriers and at least one organic electroluminescent layer sandwiched between the two electrodes. Typically although not necessarily, the anode would be a thin film of, for example, indium-tin-oxide (ITO), a semi-transparent conductive oxide which is commercially readily available already deposited on glass or plastic substrates. The organic layer(s) would then normally be deposited onto the ITO-coated substrate by, for example, evaporation/sublimation or spin-coating, blade-coating, dip-coating or meniscus-coating. The final step of depositing the cathode layer onto the top organic layer is normally performed by thermal evaporation or sputtering of a suitable cathode metal in vacuum. Layers of Al, Ca or alloys of Mg:Ag or Mg:In, or Al alloys are often used as cathode materials.

One of the key advantages of the OLED technology is that devices can be operated at low drive voltages, provided that suitable electroluminescent organic layers and electrodes with good efficiencies for the injection of positive and negative charge are used. In order to achieve good performance in OLEDs it is of great importance to optimise all the individual layers, the anode, the cathode and the organic layer(s), as well as the interfaces between the layers.

A cathode of high quality is of great importance to achieve overall high performance in OLEDs, judged on criteria such as power efficiency, low drive voltage, shelf life, operating life, and stability in stringent environmental conditions such as high temperature and/or high humidity, etc. The criteria for the quality of the cathode are in particular but not exclusively the work function, corrosion resistance, morphology and barrier properties, adhesion to the polymer and sheet resistance.

Metallic cathode layers for OLEDs are most commonly deposited by simple thermal evaporation of the cathode material in vacuum. Similarly, cathode layers consisting of a metal alloy can be deposited by thermal evaporation from two or more sources containing the alloy constituents and by choosing appropriate relative depositing rates to achieve the desired relative alloy composition.

However, simple thermal evaporation of metals onto OLEDs to form a cathode layer can result in poor adhesion between the cathode and the top organic layer and, very often, the morphology of the evaporated layer is polycrystalline with large average grain size such that there is a high density of grain-boundary for diffusion of ambient gases such as oxygen and moisture into the device. Poor adhesion and large grain-size polycrystalline morphology can severely deteriorate the OLED performance, in particular environmental stability (device shelf-life and operating life, corrosion of the cathode).

The same issues (adhesion, morphology) apply to the case in which an OLED is built up from the cathode, i.e. when the cathode is deposited on the substrate with the subsequent deposition of the organic layer(s) and as the final step deposition of the anode on top of the top organic layer.

Simple thermal evaporation from different sources of elemental metal or evaporation of a ready-made alloy to obtain cathodes in alloy form also has problems. For example, if a cathode alloy layer comprising reactive low work function elements, such as alkali or earth-alkali metals, is required the processing and/or handling of these elements in a normal environment in air may be difficult if not impossible. Alternatively, if an alloy itself is evaporated, the alloy composition of the deposit (cathode) may be difficult to control due to, for example, different thermal properties and differential evaporation rates of the source-alloy constituents.

It is thus an object of the present invention to provide a structure and method of fabrication for an organic electroluminescent device that overcomes, or at least minimises, the above-described problems.

According to a first aspect of the present invention there is provided an organic light-emitting device, comprising at least one layer of a light-emissive organic material arranged between first and second electrodes, wherein at least one of the electrodes is a multi-layered structure, each layer of the multi-layered structure being a DC magnetron sputtered layer.

This first aspect of the invention also provides a method of fabricating an organic light-emitting device, comprising the steps of:

forming an electrode over a substrate;

forming at least one layer of a light emissive organic material over the electrode; and forming a multi-layered electrode structure over the at least one layer of organic material, each layer of the multi-layered structure being a DC magnetron sputtered layer.

This first aspect of the invention further provides a method of fabricating an organic light-emitting device, comprising the steps of:

forming a multi-layered electrode structure over a substrate, each layer of the multilayered structure being a DC magnetron sputtered layer;

forming at least one layer of a light-emissive organic material over the multi-layer ed electrode ; and forming an electrode over the at least one layer of organic material.

According to a second aspect of the present invention there is provided an organic light-emitting device, comprising:

a first electrode;

two or more layers of light-emissive organic material formed over the first electrode, wherein the uppermost layer of organic material is more resistant to sputter deposition than the underlying layer of organic material; and a second electrode formed over the uppermost layer of organic material, wherein the second electrode comprises at least one layer, the layer adjacent the uppermost layer of organic material being a sputtered layer.

This second aspect of the invention also provides n organic light-emitting device, wherein-the uppermost layer of organic material is substantially resistant to sputter deposition.

Thus, the first and second aspects of the invention provide an organic electroluminescent device with a metallic cathode of compact morphology with low average grain size and good adhesion to the adjacent layer of the OLED stack with the said cathode laid down by sputter deposition. Good adhesion between the cathode and the adjacent layer minimises delamination and the ingress of, for example, oxygen, moisture, solvents or other low molecular weight compounds at/along said interface. Also, the compact morphology of the cathode metal layer minimises diffusion of ambient species such as oxygen, moisture, solvents or other low molecular weight compounds into the OLED through the cathode layer itself. Said cathode forms the electron injecting electrode for an OLED with at least one electroluminescent organic layer between said cathode and an anode that injects positive charge carriers. The organic electroluminescent layer(s) are preferably but not necessarily conjugated polymers.

In the first aspect of the invention the sputter deposition process is DC magnetron sputtering. In the second aspect of the invention the light-emissive organic material comprises two or more layers, the uppermost layer being more sputter resistant to sputter deposition than the underlying layer of organic material.

Figure 1:
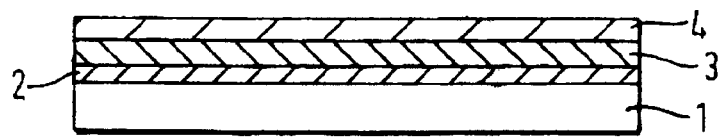
FIG. 1 illustrates an OLED.
Figure 2:
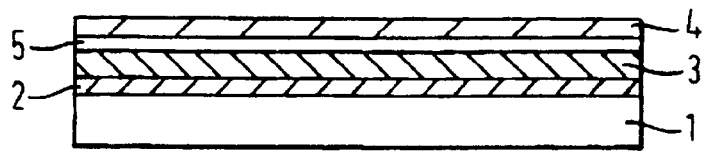
FIG. 2 illustrates an OLED in accordance with a first embodiment of the present invention.

In an illustrative example, OLED is formed by a semi-transparent anode deposited onto a transparent supportive substrate. The substrate is, for example, a sheet of glass of thickness between 30 $\mu$m and 5 mm but preferably $\leq$1.1 mm or alternatively a sheet of plastic such as polyester, polycarbonate, polyimide, poly-ether-imide or the like. The semitransparent anode is preferably but not necessarily a thin layer of conductive oxide such as indium-tin-oxide, doped tin-oxide or zinc-oxide. The organic layer(s) deposited on top of the anode/substrate is/are preferably but not necessarily one or more layers of an electroluminescent conjugated polymer such as described in U.S. Pat. No. 5,247,190, typically of the order of 100 nm thick. Alternatively the organic layer(s) could be low molecular weight compounds such as described in the U.S. Pat. No. 4,539,507 or indeed a combination of a conjugated polymer with a low molecular weight compound. The cathode, deposited by means of sputtering on top of the top organic layer, is a metal capable of injecting electrons into the adjacent organic layer and is typically but not necessarily of the order of 100–500 nm thick. Examples of such metals are—but are not limited to—Al, Mg, In, Pb, Sm, Tb, Yb or Zr. The adhesion and compact morphology of such sputter deposited metal layers is far superior compared to those deposited by thermal evaporation; hence device stability and corrosion resistance of the cathode is significantly improved, particularly in cases in which ambient oxygen, moisture, solvents or other low molecular weight compounds are present during the post-cathode deposition fabrication process or the operation of the devices.

Alternatively, said cathode deposited by sputtering is an alloy sputtered from an alloy sputtering target. Such alloys are—but not limited to—alloys of Al, Zr, Mg, Si, Sb, Sn, Zn, Mn, Ti, Cu, Co, W, Pb, In or Ag or combinations thereof and containing low work function elements such as Li, Ba, Ca, Ce, Cs, Eu, Rb, K, Sm, Na, Sm, Sr, Tb or Yb. A typical such alloy would, for instance, be a commercially available Al95%/Li2.5%/Cu1.5/Mg1% alloy. Said low work function elements are in pure elemental form normally very susceptible to oxidation and corrosion by moisture such that handling in a normal laboratory environment is very problematic if not impossible. However, in a matrix of more stable metals such as listed above these low work function elements can—at sufficiently low concentrations in the matrix element—be stable enough to allow sputter target fabrication, handling of the target and sputter deposition of the target alloy onto an OLED in standard sputter equipment in a normal laboratory or manufacturing environment with subsequent stability of the cathode on the OLED after sputter deposition. In this example the low work function element(s) act to improve electron injection and device efficiency, the matrix element provides environmental stability and the sputter deposition process again improves adhesion, gives a compact morphology and—by choice of the target composition and the sputter conditions—allows to control the composition of the cathode alloy as deposited. The alloy morphology achieved specifically by DC magnetron sputter deposition can act to minimise, for example, segregation and diffusion effects within the cathode alloy after the deposition. In this way OLEDs can be produced in ambient conditions with low work function cathodes which provide efficient electron injection into the organic layer(s).

Turning now to FIG. 1, a first OLED is realised by depositing a ca. 1000 Å thick layer 3 of poly(p-phenylene vinylene) (PPV) on a substrate 1 pre-coated with a layer 2 of semi-transparent indium-tin-oxide (ITO) having a transparency of at least 80% in the visible range and a sheet resistance of less than 100 ohms/square, such as described in U.S. Pat. No. 5,247,190. A cathode, comprising a ca. 150 nm thick layer 4, is deposited on top of the PPV layer 3 by DC magnetron sputtering under the following conditions: Al95%/Li2.5%/Cu1.5%/Mg1% target, sputtering in constant power mode at ca. 3.2 W/cm$^2$ (100 mm diameter target and 250 W), pressure ca. 5×10$^{-3}$ mbar at 25 sccm argon flow (base pressure ca. 1×10$^{-6}$ mbar), target voltage 400–410V, target-substrate distance 75 mm and a deposition rate of ca. 1 nm/sec. An OLED made this way has a low turn-on and operating voltage (<5V), improved efficiency over similar devices with cathodes of even pure Ca, and the cathode material in the form of a sputter target and as a film deposited on the OLED is environmentally stable and can be handled in a normal laboratory environment.

In another example the OLED deposited by sputtering is a double layer structure in which the first layer of the cathode, adjacent to the top organic layer, is a thin layer of a low work function element or an alloy containing a low work function element, such as described herein above with respect to the cathode, and in which said thin first low work function element containing layer is capped with a second thick layer of a stable conductive layer. The thin first cathode layer can, for instance, be an alloy containing Li and is typically $\leq$20 nm but preferably $\leq$5 nm thick. The thick second cathode layer can, for instance, be Al, Al-Cu, Al-Si or other alloys, is preferably at least 100 nm thick and acts to protect the thin first cathode layer, provides environmental stability to the device and provides a low sheet resistance of the cathode. Alloys do very often show surface segregation effects whereby, for example, one of the alloy elements gets preferentially enriched at interfaces/surfaces. A double cathode layer structure in which low work function elements are only contained to a small percentage and that only in a thin first cathode layer minimises problems with the enrichment of, for instance, the low work function element at the interface with the adjacent organic layer which could, for example, lead to increased reactivity or intolerable amounts of diffusion of the low work function element into the organic layer(s) which could result in intolerable levels of subsequent doping of the organic layer and a possible reduction in device efficiency. Said thin first cathode layer can readily be obtained and its thickness be controlled by, for example controlling the pass-by speed of the sample over the sputter zone, together with the deposition rate.

Preferably, in any such two layer thin/thick cathode, the ratio of thickness of the first layer of conductive material to the second layer of conductive material is at least 20:1.

In another example and referring to the two layer thin/thick cathode structure described above, said second, thick conductive cathode layer could alternatively be a semi-transparent conductive oxide, such as for instance indium-tin-oxide (ITO).

In another example, referring to the two layer thin/thick cathode structure described above, only the second thick layer of the cathode is deposited by sputtering and the first thin layer is deposited by other means such a thermal evaporation. This is useful in cases in which, for instance, the top organic layer is sensitive to damage by the sputter process—without or with employing reactive sputtering such as used in the reactive sputter deposition of semi-transparent conductive oxides. In this embodiment the first layer would still form the electronic interface of the cathode with the adjacent organic layer but the second thick DC magnetron sputtered layer would form a morphologically compact protective and conductive film.

In another example a sputtered cathode deposited as a top layer of the OLED also provides, due to its good adhesion, compact morphology and good barrier properties, as an encapsulation layer for the device which provides protection against the ingress into the device of undesirable substances such as reactive gases and liquids which may be present during subsequent processing steps and/or the shelf life and operating life of the device.

According to another example there is provided an OLED in which improved charge carrier balance and device efficiency is achieved by the introduction of a sputtered very thin film of a stoichiometric or sub-stoichiometric dielectric under the cathode with said thin film of dielectric being $\leq 5$ nm thick. OLEDs often show better injection and transport for positive charge carriers compared to negative charge carriers. It has been found that thin films of dielectrics of thicknesses $\leq 5$ nm can have substantially higher transmission rates for electrons than for holes (positive charge carriers); this can be particularly the case for stoichiometric and sub-stoichiometric metal oxides. Therefore such thin dielectric layers between the cathode and the top organic layer can improve device efficiency.

Thus, according to this example, an OLED is composed of an anode on a supporting substrate (such as ITO-coated glass) with at least one organic electroluminescent layer which is covered with a thin ($\leq 5$ nm) layer of a dielectric which is then coated with a metallic cathode according to the first and/or second aspects of the invention. The dielectric is preferably, but not limited to, metal oxides, either stoichiometric or sub-stoichiometric (oxygen deficient), and deposited onto the top organic layer by sputtering with the other elements of the OLED according to the first and/or second aspects of the invention. Typically but not necessarily the oxide would be formed by reactive DC magnetron sputtering in oxygen with Al, Mg, Zr or other elemental metal targets or indeed an oxide reactively sputtered from an Al:Mg, Al:Li, Al:Li:Cu:Mg, or other alloy sputter target.

Referring now to an OLED with a stable low work function cathode and improved efficiency is realised by depositing a ca. 100 nm thick layer 3 of poly(p-phenylene vinylene) on a substrate 1 precoated with a layer 2 of semi-transparent indium-tin-oxide having a transparency of at least 80% in the visible range and a sheet resistance of less than 100 Ohms/square, such as described in U.S. Pat. No. 5,247,190. The PPV layer 3 is coated with a ca. 3 nm thick layer 5 of a stoichiometric oxide of Al95%/Li2.5%/Cu1.5%/Mg1% realised by reactive DC magnetron sputtering under the following conditions: target-substrate distance 75 mm, base pressure $1\times10^{-6}$ mbar, power supply mode at constant voltage of 310V, current density 6.2 mA/cm$^2$, pressure $5\times10^{-3}$ mbar, 25 sccm argon flow, 2 sccm oxygen flow, deposition time 7 sec. A cathode, comprising a ca. 150 nm thick layer 4, is deposited on top of the thin oxide layer 5 by a DC magnetron sputtering in the manner as described above. The cathode preferably comprises a conductive layer having a thickness of from 100 to 500 nm. This device shows improved efficiency over an equivalent device with the same cathode but without the thin oxide layer.

An OLED with a sputtered cathode, as described above and in which the organic layer adjacent to the cathode (the top organic layer) is a conjugated polymer which is particularly amenable to subsequent sputter deposition and protects underlying organic layers from the sputtering process but does otherwise not deteriorate the overall device performance beyond intolerable levels is described in another example.

With respect to this example it has been found that the nature of the top organic layer can greatly determine the success of a subsequent sputter deposition, as judged by the efficiency of electron injection, the OLED driver voltage or reliability and yield of device manufacture and indeed damage to the top organic layer due to the sputter deposition process itself. It has been found that sputter deposition of metal and alloys can be readily used on morphologically very compact and mechanically tough conjugated polymers such as, for example, poly(p-phenylene vinylene), PPV, without any obvious signs of great damage to the polymer and the interface.

This is less so that case with "softer" soluble polymers such as, for example, soluble derivatives of PPV with di-alkoxy side chains. In the case of these softer polymers the sputter deposition process can more easily result in a damage of the top polymer layer and the interface such that, for example, the device drive voltage is increased and devices are more prone to shorting.

According to the described example, in OLEDs with "softer" polymers as the main active and electroluminescent layers this/these said layer(s) are protected with a thin top layer of a morphologically very compact and mechanically tough conjugated polymer, such as but not exclusively PPV, in order to make the device more amenable to a final sputter deposition of a cathode with or without minimised damage to the device and with the subsequent advantages of a sputtered cathode as outlined in the hereinabove. Said layer of protective tough polymer is typically of the order of a few tens of nm thick but the thickness is preferably in the range of 5 to 20 nm. The optical, electronic and transport properties of, for example, PPV on top of di-alkoxy derivatives of PPV are such that device properties such as efficiency or emission colour are not greatly changed compared to a device without the protective PPV layer.

Figure 3:
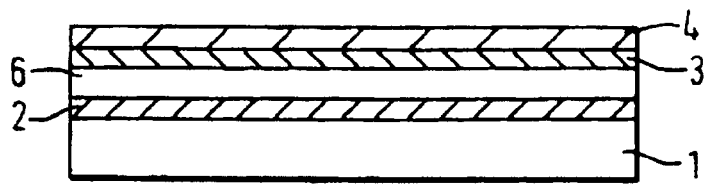
FIG. 3 illustrates an OLED in accordance with a second embodiment of the present invention.

In a second specific example illustrated with reference to FIG. 3, an OLED is realised by depositing a ca. 100 nm thick layer 6 of poly(2-methoxy,5-(2'-ethyl-hexyloxy)-p-phenylene vinylene) [MEH-PPV] spun from a xylene solution on a substrate 1 pre-coated with a layer 2 of semi-transparent indium-tin-oxide. The MEH-PPV layer 6 is then coated with a thin layer 3 of poly(p-phenylene vinylene) (ca. 20 nm after conversion). The spinning of the PPV precursor solution on top of the MEH-PPV layer 6 is possible due to the use of immiscible solvents for the MEH-PPV and the PPV precursor, and the conversion of the PPV precursor to PPV does not apparently harm the MEH-PPV. A cathode, comprising a ca. 150 nm thick layer 4, is deposited on top of the thin PPV layer 3 by DC magnetron sputtering in the manner as described above. Such an OLED gives the orange/red emission characteristic of MEH-PPV and has a low drive voltage (ca. 5–6 V) due to the air-stable low work function sputter-deposited cathode alloy. Equivalent devices in which the cathode is sputtered in the same way but directly on top of MEH-PPV layer, i.e. without a PPV buffer layer, tend to have drive voltages in excess of 10 V and are very prone to shorting, due possibly to damage of the upper surface of the MEH-PPV layer during the sputtering process.

In another example the cathode is already deposited onto a supporting substrate of an OLED. The substrate with the cathode is coated with at least one organic electroluminescent layer and the second and top electrode is the anode deposited by sputtering.

In one arrangement of this example said top sputtered anode layer is a layer of a high work function metal such as but not limited to C, Ag, Au, Co, Ni, Pd, Pt, Re, Se or alloys thereof, or doped semiconducting compounds or more generally conductive layers with work functions above 4.7 eV. Alternatively said anode is a layer of a conductive sputtered oxide, such as but not limited to indium-tin-oxide, or doped Sn-oxide or Zn-oxide.

In another arrangement of this example, referring to the case in which said top anode is a conductive oxide deposited by reactive sputtering, the top organic layer is first coated with a thin layer of a high work function element or alloy such as but not limited to C, Au or Pt by either sputter deposition or other means such as thermal evaporation, before the thick sputter deposited conductive oxide is applied. In this case damage to the top organic layer by the reactive sputter deposition process is minimised. In the cases in which the anode needs to be at least semi-transparent the thin interface layer between the top organic layer and the semi-transparent oxide needs to be less than 10 nm but preferably less than 5 nm thick in order to preserve transparency.

Figure 4:
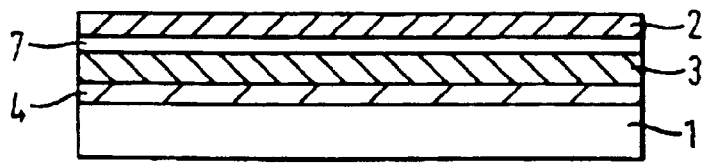
FIG. 4 illustrates a further OLED.

A further OLED, referring to FIG. 4, is realised by coating a ca. 100 nm thick layer 3 of poly(p-phenylene vinylene) on top of a substrate 1 coated with a layer 4 of Al which acts as the cathode. After conversion of the PPV precursor polymer to PPV the PPV is coated with a thin (<5 nm) layer 7 of thermally evaporated Au which is then capped with a 150 nm thick layer 2 of indium-tin-oxide in a standard commercial reactive DC magnetron ITO deposition process. The thin layer 7 of Au ensures the efficient injection of positive charge carriers but also provides a buffer layer which protects the underlying PPV layer 3 during the reactive ITO deposition process.

The present invention thus describes organic electroluminescent device structures and methods of fabricating the same in which the second, i.e. top, electrode is at least in part realised by sputtering. Said sputtered electrode layer assures a compact dense electrode morphology with good barrier and adhesion properties and the sputter deposition process itself also allows the use of alloys which combine environmental stability with desired electronic properties such as low work function.

A protective insulating layer may be sputtered over the sputtered top electrode without exposing the OLED to ambient atmosphere between the deposition of the top electrode and said insulating layer and said insulating layer being, for example, an oxide or a nitride.

A method of fabrication of an organic electroluminescent device wherein at least one of the electrodes is at least in part realised by sputter deposition of a metallic element or alloy or conductive oxide or semiconductor is also disclosed.

It has been found that one of the mechanisms which limits device performance and in particular device lifetime can be the degradation of the organic layer adjacent to the inorganic oxide anode and the interface between said anode and the adjacent organic layer due to, for example, oxygen released from said oxide anode, with the organic layer. In this context it has been found that the incorporation of thin layers of, for example, semiconductive polymers such as polyaniline, as a first organic layer on top of the inorganic oxide anode results in improved device characteristics and operating stability. The introduction of such additional layers as first organic layer on top of the inorganic oxide anode can, however, introduce other problems such as deteriorated adhesion, mixing of said first organic layer with subsequent layers which may in some cases be undesired, a deterioration in the wetting and coating properties of subsequent layers, problems with uniform deposition of thin layers of said first organic layer or problems with the stability of said first organic layer under device operation.

Figure 5:
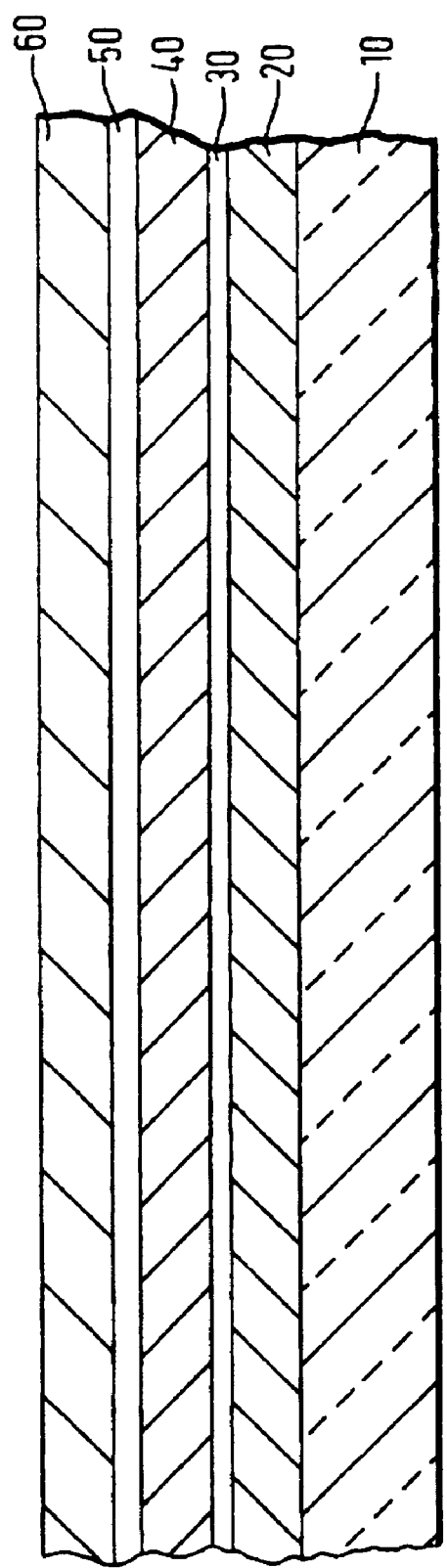
FIG. 5 illustrates an OLED with an improved anode.

FIG. 5 illustrates a structure for an organic light-emitting device that has the advantage of separating the inorganic oxide semi-transparent anode from the first organic layer, but maintains effective injection of positive charge carriers and avoids some of the above mentioned problems.

The structure comprises at least one layer of a light-emissive organic material arranged between an anode and a cathode for the device, wherein the anode comprises a first light-transmissive layer of an inorganic oxide and a second light-transmissive layer of a conductive material having a high work function arranged between the at least one layer of organic material and the first layer of inorganic oxide, the second layer of conductive material being substantially thinner than the first layer of inorganic oxide.

The cathode may be formed over a substrate and the anode formed over the at least one layer of organic material. Alternatively, the anode may be formed over a substrate and the cathode is formed over the at least one layer of organic material.

The first layer of inorganic oxide may be sputter deposited, preferably by DC magnetron or RF sputtering, or evaporated preferably by resistive or electron-beam thermal evaporation. The second layer of conductive material may be sputter deposited, preferably by DC magnetron or RF sputtering, or evaporated preferably by resistive or electron-beam thermal evaporation.

The ratio of thicknesses of the first layer of inorganic oxide to the second layer of conductive material is preferably at least 15:1.

The structure of FIG. 5 provides an organic light-emitting device (OLED) in which the semi-transparent inorganic oxide anode, for example indium-tin-oxide (ITO), tin oxide, or zinc oxide is coated with a thin semi-transparent layer of a conductive material with a work function of at least 4.7 eV prior to the deposition of the first organic layer of the OLED stack. The thickness of said thin layer is at most 10 nm but preferably 3–7 nm. Said thin layer can be Ag, As, Au, C, Co, Ge, Ni, Os, Pd, Pt, Re, Ru, Se, Te or alloys or inter-metallic compounds containing these elements. Alternatively said thin layer can be a doped semiconductor such as p-type doped ZnS or ZnSe. Said thin High work function layer is covered with at least one organic electroluminescent layer, preferably a conjugated polymer, and the structure is completed with a cathode as top electrode.

In a preferred embodiment the think semi-transparent conductive high work function layer is a layer of carbon between 3 and 7 nm thick.

In another preferred embodiment the organic electroluminescent film is a soluble conjugated polymer such as an alkoxy-derivative of poly(p-phenylene vinylene).

In another embodiment there is provided an OLED which is built up from a substrate with a cathode as a first electrode, which is then covered with at least one electroluminescent layer, preferably a conjugated polymer, and in which the top organic layer is covered with a thin semi-transparent high work function layer according to the first aspect of the invention prior to the deposition of a thicker semi-transparent conductive oxide top anode layer.

The structure of FIG. 5 may be fabricated by a method comprising the steps of:

forming an anode for the device over a substrate, which step comprises forming a first light-transmissive layer of an inorganic oxide over a substrate and forming a second light-transmissive layer of a conductive material having a high work function over the first layer of inorganic oxide, the second layer of conductive material being substantially thinner than the first layer of inorganic oxide;

forming at least one layer of a light-transmissive organic material over the anode; and forming a cathode for the device over the at least one layer of organic material.

An alternative, "inverse", structure may be fabricated by a method comprising the steps of:

forming a cathode for the device over a substrate;

forming at least one layer of a light-transmissive organic material over the anode; and forming an anode for the device over the at least one layer of organic material, which step comprises forming a second light-transmissive layer of a conductive material having a high work function over the at least one layer of organic material and forming a first light-transmissive layer of an inorganic oxide over the second layer of conductive material, the second layer of conductive material being substantially thinner than the first layer of inorganic oxide.

In a method of fabrication for an OLED according to the structure of FIG. 5, a thin semi-transparent high work function layer is deposited in between a semi-transparent conductive oxide anode and the adjacent first organic layer. Said thin semi-transparent high work function layer is applied by sputter deposition or by resistive or electron-beam thermal evaporation.

Specifically referring now to FIG. 5, a glass substrate 10 is covered with a layer of a semi-transparent conductive indium-tin-oxide (ITO) layer 20, typically about 150nm thick with a sheet resistance of typically $\leq 30$ Ohms/square. The substrate may alternatively comprise a plastics material. Said ITO layer 20 is covered with a 6 nm thick layer 30 of electron-beam evaporated carbon of 99.997% purity. Said layer 30 is then covered with a ca. 100 nm thick layer 40 of poly(2-methoxy-5-(2'-ethyl-hexyloxy) 1,4-phenylene vinylene), abbreviated as MEH-PPV, which is spun onto layer 30 from a xylene solution. Said MEH-PPV layer is then covered with a cathode composed of a first layer 50 of ca. 50 nm of Ca capped with a second protective layer 60 of ca. 200 nm of Al. This OLED device has improved device performance and in particular improved operating stability compared to a device without the carbon layer between the ITO and the MEH-PPV.

Thus there has been described a device structure and process of fabrication for an OLED with an efficient anode structure for injecting positive charge carriers which uses a semi-transparent thin conductive oxide anode to achieve transparency and conductivity but which avoids direct contact of said conductive oxide anode with adjacent organic layers which may be degraded in immediate contact with said oxide anode.

What is claimed is:

1. A method of fabricating an organic light-emitting device, comprising the steps of:

forming a first electrode over a substrate;

forming two or more layers of light-emissive material over the first electrode, wherein the uppermost layer of organic material is more resistant to sputter deposition than the underlying layer of organic material; and forming a second electrode over the uppermost layer of organic material, wherein the second electrode comprises at least one layer, the layer adjacent the uppermost layer of organic material being a sputtered layer.

2. A method of fabricating an organic light-emitting device according to claim 1, wherein the uppermost layer of organic material is a conjugated polymer.

3. A method of fabricating an organic light-emitting device according to claim 1, wherein the step of forming the multilayered electrode structure comprises the steps of sputtering a first layer of conductive material having a low work function over the at least one layer of organic material and sputtering a second layer of conductive material over the first layer of conductive material, the first layer of conductive material being substantially thinner than the second layer of conductive material.

4. A method of fabricating an organic light-emitting device according to claim 1, wherein the first layer of conductive material has a thickness of at most 20 nm.

5. A method of fabricating an organic light-emitting device according to claim 1, wherein the step of forming the multilayered electrode structure comprises the steps of sputtering a first layer of conductive material having a high work function over the at least one layer of organic material and sputtering a second layer of conductive material over the first layer of conductive material, the first layer of conductive material being substantially thinner than the second layer of conductive material.

6. A method of fabricating an organic light-emitting device according to claim 5, wherein the first layer of conductive material has a thickness of less than 10 nm.

* * * * *

UNITED STATES PATENT AND TRADEMARK OFFICE
CERTIFICATE OF CORRECTION

PATENT NO. : 6,402,579 B1  
DATED : June 11, 2002  
INVENTOR(S) : Pichler et al.

Page 1 of 1

It is certified that error appears in the above-identified patent and that said Letters Patent is hereby corrected as shown below:

Column 10,  
Line 34, please delete "the" (second occurrence) and substitute -- a --  
Line 43, "claim 1" should read -- claim 3 --  
Line 46, please delete "the" (second occurrence) and substitute -- a --

Signed and Sealed this

Twelfth Day of November, 2002

*Attest:*

JAMES E. ROGAN  
*Director of the United States Patent and Trademark Office*

*Attesting Officer*